United States Patent
Chen et al.

(10) Patent No.: US 12,040,300 B2
(45) Date of Patent: Jul. 16, 2024

(54) SEMICONDUCTOR PACKAGE USING HYBRID-TYPE ADHESIVE

(71) Applicant: Airoha Technology Corp., Hsinchu (TW)

(72) Inventors: Ying-Chih Chen, Hsinchu (TW); Min-Yu Lin, Hsinchu (TW); Kuo-Chang Chang, Hsinchu County (TW); Jen-Chan Huang, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 114 days.

(21) Appl. No.: 17/853,870

(22) Filed: Jun. 29, 2022

(65) Prior Publication Data
US 2023/0136631 A1 May 4, 2023

Related U.S. Application Data
(60) Provisional application No. 63/275,470, filed on Nov. 4, 2021.

(51) Int. Cl.
| | | |
|---|---|---|
| *H01L 23/00* | (2006.01) | |
| *H01L 25/065* | (2023.01) | |
| *H01L 25/18* | (2023.01) | |

(52) U.S. Cl.
CPC .......... *H01L 24/29* (2013.01); *H01L 25/0657* (2013.01); *H01L 25/18* (2013.01); *H01L 2224/29076* (2013.01); *H01L 2224/2908* (2013.01); *H01L 2224/29082* (2013.01); *H01L 2224/8385* (2013.01); *H01L 2225/0651* (2013.01); *H01L 2225/06524* (2013.01);
(Continued)

(58) Field of Classification Search
CPC ............ H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 2224/2908–29082; H01L 23/552; H01L 2224/29006–29007; H01L 2224/29027–29036
See application file for complete search history.

(56) References Cited

U.S. PATENT DOCUMENTS

| | | | | |
|---|---|---|---|---|
| 6,657,290 B2 * | 12/2003 | Fukui | ...................... | H01L 24/33 257/E29.022 |
| 8,841,776 B2 * | 9/2014 | Nishimura | .............. | H01L 24/27 257/777 |

(Continued)

FOREIGN PATENT DOCUMENTS

| | | | |
|---|---|---|---|
| TW | 201230288 A1 | 7/2012 | |
| TW | 201322389 A1 | 6/2013 | |

(Continued)

*Primary Examiner* — Nelson Garces
*Assistant Examiner* — Quinton A Brasfield
(74) *Attorney, Agent, or Firm* — Winston Hsu

(57) ABSTRACT

A semiconductor package includes a first die, a second die, and a hybrid-type adhesive. The second die is stacked on the first die through the hybrid-type adhesive. The hybrid-type adhesive includes a conductive adhesive and a non-conductive adhesive. The conductive adhesive is disposed between the non-conductive adhesive and the first die. The non-conductive adhesive is disposed between the conductive adhesive and the second die.

17 Claims, 3 Drawing Sheets

(52) U.S. Cl.
CPC ............... *H01L 2225/06562* (2013.01); *H01L 2924/1421* (2013.01); *H01L 2924/1438* (2013.01)

(56) References Cited

U.S. PATENT DOCUMENTS

| | | | | |
|---|---|---|---|---|
| 2007/0052089 | A1* | 3/2007 | Kim | ............................ C09J 7/10 257/E21.705 |
| 2008/0237821 | A1* | 10/2008 | Kim | ........................ H01L 24/32 257/678 |
| 2011/0267796 | A1* | 11/2011 | Yoshimura | .............. H01L 24/83 156/295 |
| 2012/0115277 | A1* | 5/2012 | Lee | ..................... H01L 25/0657 257/E21.504 |
| 2019/0385935 | A1 | 12/2019 | Gao | |
| 2020/0013754 | A1 | 1/2020 | Gao | |
| 2020/0227387 | A1* | 7/2020 | Xu | ........................... H01L 24/06 |
| 2021/0159213 | A1* | 5/2021 | Kim | ........................ H01L 24/83 |
| 2021/0242152 | A1 | 8/2021 | Fountain, Jr. | |

FOREIGN PATENT DOCUMENTS

| | | | |
|---|---|---|---|
| TW | 201604980 | A | 2/2016 |
| TW | 201620815 | A | 6/2016 |
| TW | 201715621 | A | 5/2017 |
| TW | 201803053 | A | 1/2018 |
| WO | 93/23982 | | 11/1993 |

\* cited by examiner

SEMICONDUCTOR PACKAGE USING HYBRID-TYPE ADHESIVE

CROSS REFERENCE TO RELATED APPLICATIONS

This application claims the benefit of U.S. Provisional Application No. 63/275,470, filed on Nov. 4, 2021. The content of the application is incorporated herein by reference.

BACKGROUND OF THE INVENTION

1. Field of the Invention

The present invention relates to packaging of multiple dies, and more particularly, to a semiconductor package using a hybrid-type adhesive between two dies.

2. Description of the Prior Art

Semiconductor manufacturing has moved to smaller process nodes to achieve desired power and performance goal, functionality, form factor, and cost. With an increasing need for processing power, however, a system on chip (SoC) is becoming quite large beyond what can be fabricated with reasonable yield. Instead, integrated circuit designers are splitting their designs into multiple smaller dies, which are easier to fabricate and produce better yields. In short, a multi-die design is one where a large design is partitioned into multiple smaller dies integrated in a single package to achieve the expected power, performance and form factor goals. For example, a multi-die package may have two or more dies vertically stacked on each another within a single package to expect a smaller form factor. However, one die in a multi-die package may be an interference source of another die in the same multi-die package. For example, a victim die may be a wireless device whose receiver is affected by interference originated from an aggressor die in the vicinity of the victim die. One conventional solution may increase the distance between the victim die and the aggressor die in the same multi-die package for interference reduction, which results in a larger package form factor inevitably.

Thus, there is a need for an innovative design that is capable of enabling a multi-die package to have a compact form factor and meet the desired performance requirements.

SUMMARY OF THE INVENTION

One of the objectives of the claimed invention is to provide a semiconductor package using a hybrid-type adhesive between two dies.

According to a first aspect of the present invention, an exemplary semiconductor package is disclosed. The exemplary semiconductor package includes a first die, a second die, and a hybrid-type adhesive. The second die is stacked on the first die through the hybrid-type adhesive. The hybrid-type adhesive includes a conductive adhesive and a non-conductive adhesive. The conductive adhesive is disposed between the non-conductive adhesive and the first die. The non-conductive adhesive is disposed between the conductive adhesive and the second die.

According to a second aspect of the present invention, an exemplary semiconductor package is disclosed. The exemplary semiconductor package includes a first die, a second die, and a hybrid-type adhesive. The hybrid-type adhesive includes a conductive adhesive and a non-conductive adhesive. A first partial area of a bottom surface of the second die is adhered to a first partial area of a top surface of the first die through both of the conductive adhesive and the non-conductive adhesive. A second partial area of the bottom surface of the second die is adhered to a second partial area of the top surface of the first die through only one of the conductive adhesive and the non-conductive adhesive.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
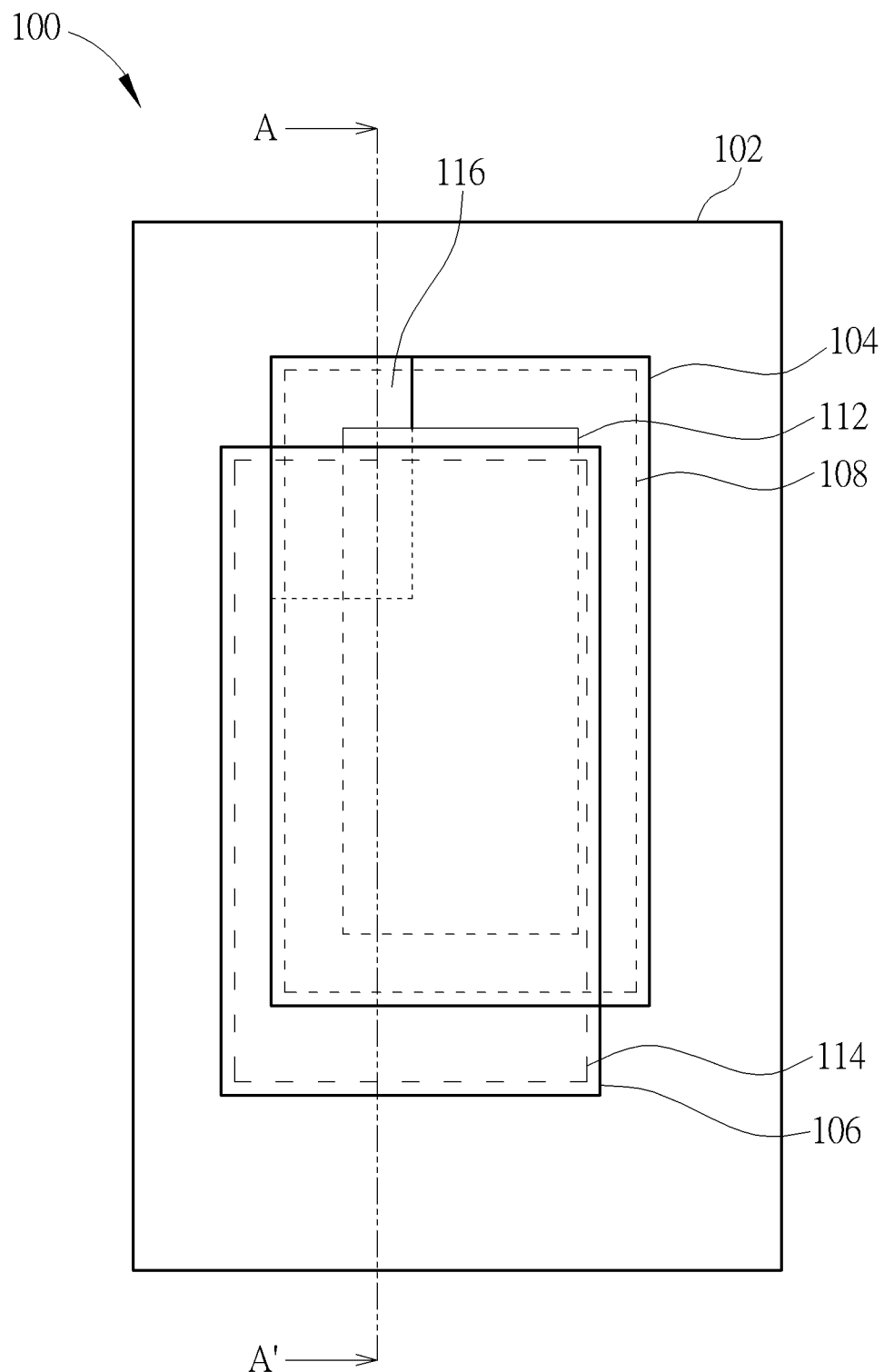
FIG. 1 is a top view of a semiconductor package according to an embodiment of the present invention.
Figure 2:
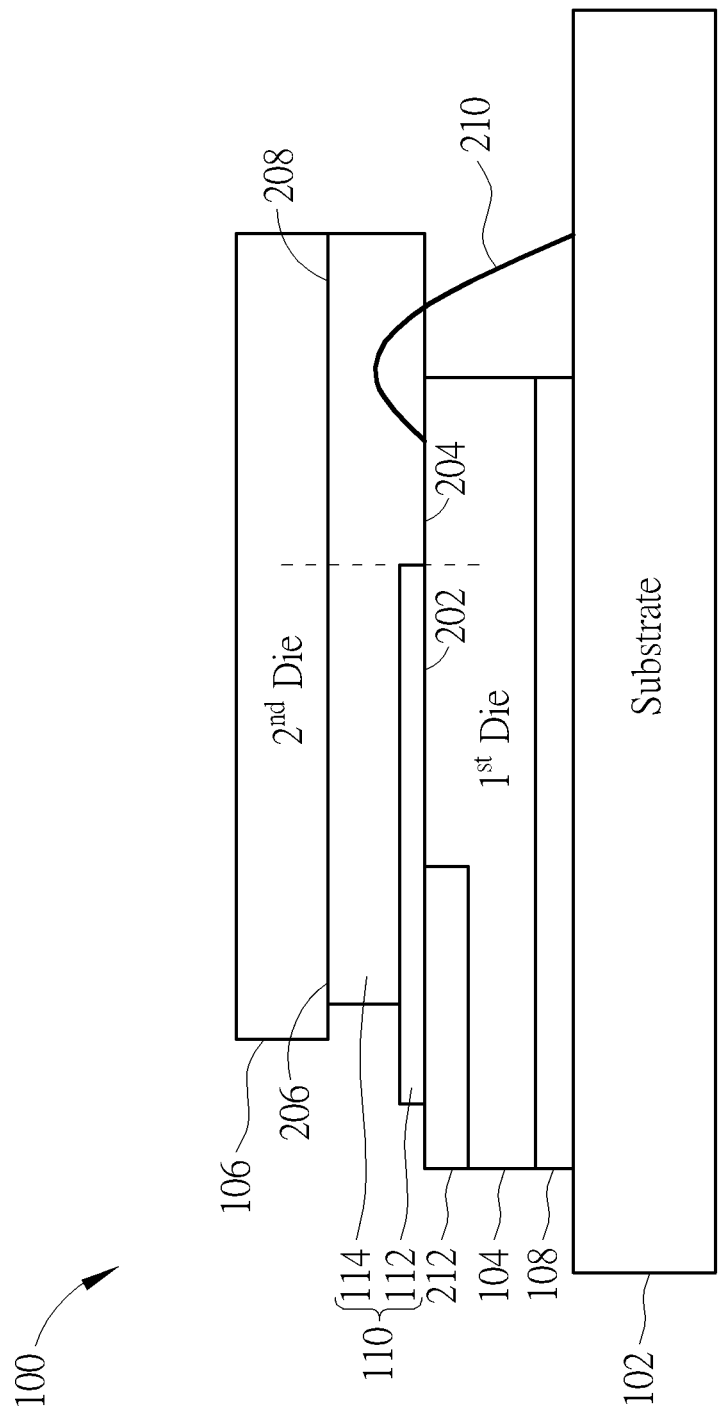
FIG. 2 is a cross-sectional view along the line A-A' of the semiconductor package shown in FIG. 1.

Please refer to FIG. 1 in conjunction with FIG. 2. FIG. 1 is a top view of a semiconductor package according to an embodiment of the present invention. FIG. 2 is a cross-sectional view along the line A-A' of the semiconductor package 100 shown in FIG. 1. The semiconductor package 100 may be a multi-die package including a substrate 102 and multiple dies (e.g. a first die 104 and a second die 106). For better comprehension, only the components pertinent to the present invention are illustrated in FIG. 1 and FIG. 2. In practice, the semiconductor package 100 may have more than two dies vertically stacked on the substrate 102. The bottom surface of the first die 104 is adhered to a top surface of the substrate 102 by an adhesive 108. For example, the adhesive 108 may be a conductive adhesive. The second die 106 is stacked on the first die 104 through a proposed hybrid-type adhesive 110 including a conductive adhesive 112 and a non-conductive adhesive (electrically insulating adhesive) 114. For example, the conductive adhesive 112 may be a conductive epoxy adhesive, and the non-conductive adhesive 114 may be a film over wire (FOW) adhesive.

As shown in FIG. 2, a first partial area 202 of a top surface of the first die 104 has contact with the conductive adhesive (e.g. conductive epoxy adhesive) 112, and a second partial area 204 of the top surface of the first die 104 has contact with the non-conductive adhesive (e.g. FOW adhesive) 114. The non-conductive adhesive 114 implemented by the FOW adhesive allows wire bonding at the second partial area 204 of the top surface of the first die 104, such that one or more bonding wires 210 can be connected to the second partial area 204 of the top surface of the first die 210.

In this embodiment, the conductive adhesive 112 applied to the first partial area 202 of the top surface of the first die 104 is used to act as shielding to prevent interference (e.g. interference from the second die 106 such as a flash memory die) from impacting sensitive electronic components (e.g. a wireless communication circuit 212, including a wireless receiver, that is fabricated within a layout area 116 of the first die 104). Specifically, when the second die 106 is stacked on the first die 104 through the proposed hybrid-type adhesive 110, a first partial area 206 of a bottom surface of the second die 106 is adhered to the first partial area 202 of the top surface of the first die 104 through both of the conductive adhesive 112 and the non-conductive adhesive 114, and a second partial area 208 of the bottom surface of the second die 106 is adhered to the second partial area 204 of the top surface of the first die 104 through only one of the conductive adhesive 112 and the non-conductive adhesive 114.

Figure 3:
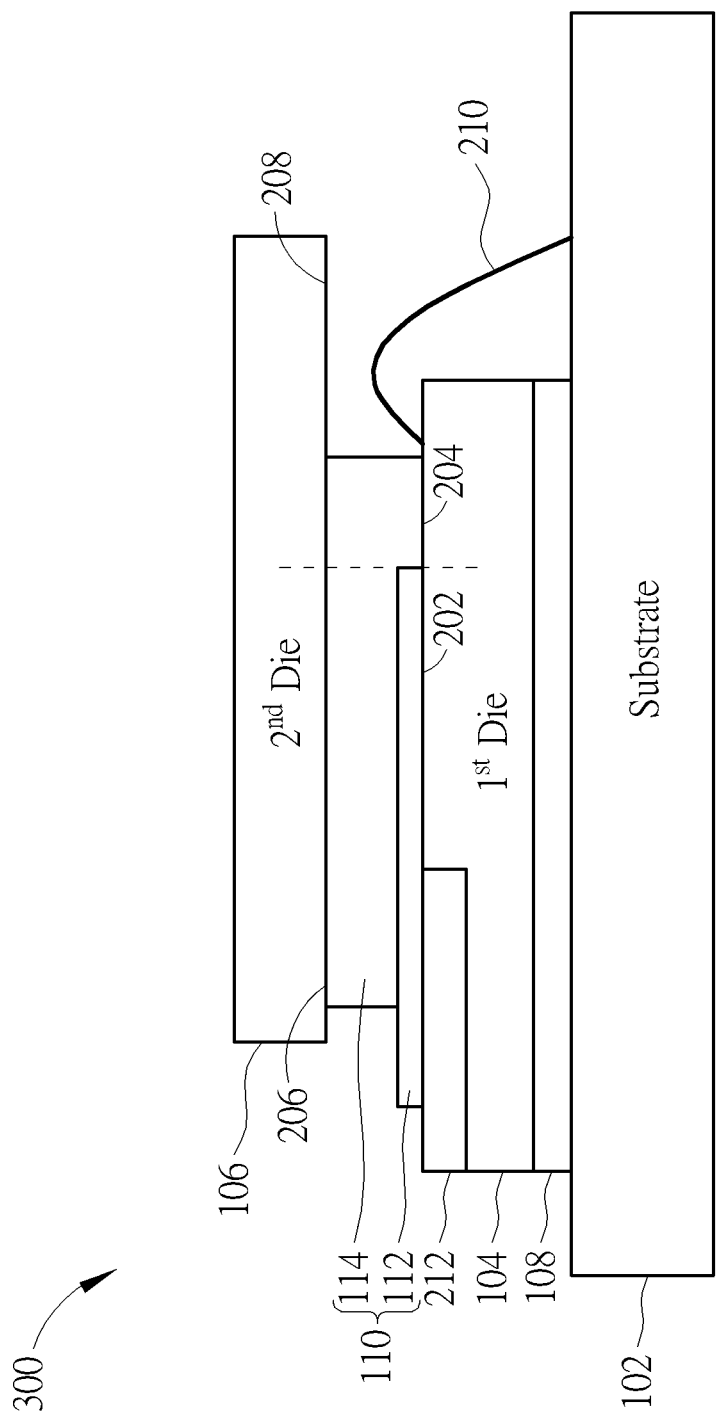
FIG. 3 is a diagram illustrating an alternative semiconductor package structure according to an embodiment of the present invention.

The top surface of the first die 104 includes non-overlapping partial areas 202 and 204, and the bottom surface of the second die 106 includes non-overlapping partial areas 206 and 208. In this embodiment shown in FIG. 2, the bonding wire 210 is connected to the second partial area 204 on the top surface of the first die 104 without having a contact with the second partial area 208 on the bottom surface of the second die 106, and the non-conductive adhesive (e.g. FOW adhesive) 114 is applied to the bonding wire 210. However, this is for illustrative purposes only, and is not meant to be a limitation of the present invention. FIG. 3 is a diagram illustrating an alternative semiconductor package structure according to an embodiment of the present invention. The semiconductor package 100 may be modified to have the non-conductive adhesive (e.g. FOW adhesive) 114 not applied to the bonding wire 210, as illustrated by the modified semiconductor package 300 shown in FIG. 3. To put it simply, any semiconductor package using the proposed hybrid-type adhesive falls within the scope of the present invention.

The wireless communication circuit (e.g. wireless receiver) 212 may suffer from radio frequency (RF) desensitization (also known as RF desense). A desensitized wireless receiver means that its noise floor is increased due to electromagnetic interference (EMI) which directly results in reduction of the received signal to noise ratio, leading to degradation of the receiver performance. The cause of RF desensitization may be the electromagnetic interference originated from an external source (e.g., a nearby electronic component such as that included in the second die 106 stacked on the first die 104). In the thickness direction of the semiconductor package 100, the conductive adhesive 112 overlaps both of the second die 106 and the layout area 116 in which the wireless communication circuit 212 is fabricated. The thickness direction of the semiconductor package 100 refers to a direction in which the fist die 104 is disposed on the substrate 102, or in which the second die 106 is disposed on the first die 104. In an embodiment, the conductive adhesive 112 fully overlaps the layout area 116. In another embodiment, the conductive adhesive 112 partially overlaps the layout area 116. With the help of EMI shielding offered by the conductive adhesive 112, the interference power picked up by the receiver antenna, which results in desensitization, can be effectively reduced. In this way, the RF performance requirement of the wireless communication circuit 212 implemented in the first die 104 can be met under the condition that the second die (e.g. flash memory die) 106 is vertically stacked on the first die 104. On the other hand, generally, interfering an inductor of the wireless communication circuit 212 by EMI results in more serious adverse effect, compared to interfering components of the wireless communication circuit 212 other than the inductor. As such, in an embodiment, the conductive adhesive 112 overlaps at least the inductor of the wireless communication circuit 212.

Furthermore, since the conductive adhesive 112 can act as EMI shielding, the second die 106 is not required to be far away from the layout area 116 in which the wireless communication circuit 212 is fabricated. In this embodiment, the second die 106 overlaps the layout area 116 in the thickness direction of the semiconductor package 100, thus resulting in a smaller package form factor.

Compared to a semiconductor package design that has a second die stacked on a first die by a conductive adhesive only, the proposed semiconductor package design that uses the hybrid-type adhesive 110 can prevent boding wires 210 (which are connected to a top surface of the first die 104) from being short-circuited and/or crushed, due to the fact that the non-conductive adhesive (e.g. FOW adhesive) 114 is much thicker than the conductive adhesive and therefore the bonding wire 210 and the second die 106 are separate from each other by a relative large distance. Compared to a semiconductor package design that has a second die stacked on a first die through an additional spacer (dummy die), the proposed semiconductor package design that uses the hybrid-type adhesive 110 can have a smaller form factor due to the fact that the hybrid-type adhesive 110 is much thinner than the spacer (dummy die). Compared to a semiconductor package design that has a second die stacked on a first die by a non-conductive adhesive only, the proposed semiconductor package design that uses the hybrid-type adhesive 110 can have better RF performance due to the fact that the conductive adhesive (e.g. conductive epoxy adhesive) 112 can act as EMI shielding. To put it simply, the proposed semiconductor package design that uses the hybrid-type adhesive 110 is capable of enabling a multi-die package to have a compact form factor and meet the desired performance requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package comprising:
   a first die;
   a second die; and
   a hybrid-type adhesive, wherein the second die is stacked on the first die through the hybrid-type adhesive, and the hybrid-type adhesive comprises:
      a conductive adhesive, wherein a first partial area of a top surface of the first die has contact with the conductive adhesive;
      a non-conductive adhesive, wherein a second partial area of the top surface of the first die has contact with the non-conductive adhesive, the conductive adhesive is disposed between the non-conductive adhesive and the first die, and the non-conductive adhesive is disposed between the conductive adhesive and the second die; and
   at least one bonding wire, connected to the second partial area of the top surface of the first die;

wherein the at least one bonding wire is partly in the non-conductive adhesive.

2. The semiconductor package of claim 1, wherein the first partial area of the top surface of the first die is not connected to any bonding wire.

3. The semiconductor package of claim 1, wherein the non-conductive adhesive has contact with both of the conductive adhesive and a bottom surface of the second die.

4. The semiconductor package of claim 1, wherein the non-conductive adhesive is a film over wire (FOW) adhesive.

5. The semiconductor package of claim 1, wherein the conductive adhesive is a conductive epoxy adhesive.

6. The semiconductor package of claim 1, wherein the first die comprises a wireless communication circuit.

7. The semiconductor package of claim 6, wherein the wireless communication circuit is fabricated within a layout area of the first die, and the second die overlaps the layout area in a thickness direction of the semiconductor package.

8. The semiconductor package of claim 7, wherein the conductive adhesive overlap both of the layout area and the second die in the thickness direction of the semiconductor package.

9. The semiconductor package of claim 6, wherein the conductive adhesive overlaps the layout area in a thickness direction of the semiconductor package.

10. The semiconductor package of claim 1, wherein the second die is a flash memory die.

11. A semiconductor package comprising:
a first die;
a second die;
a hybrid-type adhesive, comprising:
    a conductive adhesive; and
    a non-conductive adhesive; and
at least one bonding wire;
wherein a first partial area of a bottom surface of the second die is adhered to a first partial area of a top surface of the first die through both of the conductive adhesive and the non-conductive adhesive, and a second partial area of the bottom surface of the second die is adhered to a second partial area of the top surface of the first die through only one of the conductive adhesive and the non-conductive adhesive; and
wherein the at least one bonding wire is connected to the second partial area of the top surface of the first die, and the at least one bonding wire is partly in the non-conductive adhesive.

12. The semiconductor package of claim 11, wherein the first partial area of the top surface of the first die is not connected to any bonding wire.

13. The semiconductor package of claim 11, wherein the non-conductive adhesive is a film over wire (FOW) adhesive.

14. The semiconductor package of claim 11, wherein the conductive adhesive is a conductive epoxy adhesive.

15. The semiconductor package of claim 11, wherein the first die comprises a wireless communication circuit.

16. The semiconductor package of claim 15, wherein the wireless communication circuit is fabricated within a layout area of the first die, and the second die overlaps the layout area in a thickness direction of the semiconductor package.

17. The semiconductor package of claim 15, wherein the conductive adhesive overlaps the layout area in a thickness direction of the semiconductor package.

* * * * *